(12) United States Patent
Ogino et al.

(10) Patent No.: US 9,564,842 B2
(45) Date of Patent: Feb. 7, 2017

(54) DC VOLTAGE DETECTOR AND POWER CONVERTER USING THE SAME

(75) Inventors: Hiroshi Ogino, Tokyo (JP); Akinobu Ando, Tokyo (JP); Yasuhiko Hosokawa, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 0 days.

(21) Appl. No.: 14/400,037

(22) PCT Filed: May 11, 2012

(86) PCT No.: PCT/JP2012/062136
§ 371 (c)(1),
(2), (4) Date: Jan. 20, 2015

(87) PCT Pub. No.: WO2013/168282
PCT Pub. Date: Nov. 14, 2013

(65) Prior Publication Data
US 2015/0137722 A1    May 21, 2015

(51) Int. Cl.
*H02P 6/14*       (2016.01)
*H02P 27/06*      (2006.01)
(Continued)

(52) U.S. Cl.
CPC .............. *H02P 6/14* (2013.01); *G01R 19/0084* (2013.01); *G01R 21/00* (2013.01); *H02M 5/45* (2013.01);
(Continued)

(58) Field of Classification Search
CPC ............... H02P 6/14; H02P 6/08; H02P 6/001; H02K 29/00; H02K 29/08
(Continued)

(56) References Cited

U.S. PATENT DOCUMENTS 4,901,001 A * 2/1990 Saito .................... H02M 5/4505
                                                  318/779
5,396,411 A * 3/1995 Konishi .............. H02M 7/7575
                                                  363/35
(Continued)

FOREIGN PATENT DOCUMENTS

JP       10-313576        11/1998
JP       10313576 A   *  11/1998
(Continued)

OTHER PUBLICATIONS

International Search Report issued Aug. 7, 2012 in PCT/JP12/062136 filed May 11, 2012.
(Continued)

*Primary Examiner* — Kawing Chan
*Assistant Examiner* — Bradley Brown
(74) *Attorney, Agent, or Firm* — Oblon, McClelland, Maier & Neustadt, L.L.P.

(57) ABSTRACT

In a thyristor control device which converts a first AC voltage to a DC voltage and converts the DC voltage to a second AC voltage to be supplied to a synchronous motor, a DC voltage detector is configured to detect the DC voltage, and is provided with an AC voltage detector configured to detect the second AC voltage and an arithmetic circuit configured to determine the DC voltage on the basis of the second AC voltage detected by the AC voltage detector. As a result, there is no need to separately provide a DV voltage detector, which makes it possible to make the device compact in size and cheap in price.

5 Claims, 5 Drawing Sheets

(51) Int. Cl.
  *H02M 5/45* (2006.01)
  *G01R 19/00* (2006.01)
  *G01R 21/00* (2006.01)
  *H02K 29/00* (2006.01)
  *H02K 29/08* (2006.01)
  *H02P 6/08* (2016.01)
  *H02P 6/00* (2016.01)
  *G01R 31/42* (2006.01)

(52) U.S. Cl.
  CPC ............ *H02M 5/4505* (2013.01); *H02P 27/06* (2013.01); *G01R 31/42* (2013.01); *H02K 29/00* (2013.01); *H02K 29/08* (2013.01); *H02P 6/001* (2013.01); *H02P 6/08* (2013.01)

(58) Field of Classification Search
  USPC .................................................... 318/400.26
  See application file for complete search history.

(56) References Cited

U.S. PATENT DOCUMENTS

| | | | |
|---|---|---|---|
| 5,783,932 A * | 7/1998 | Namba | H02J 9/066 290/47 |
| 2013/0106328 A1* | 5/2013 | Kopiness | H02M 1/36 318/400.11 |

FOREIGN PATENT DOCUMENTS

| | | |
|---|---|---|
| JP | 2001-25292 | 1/2001 |
| JP | 2003-61380 | 2/2003 |
| JP | 2003061380 A * | 2/2003 |
| JP | 2012-10488 A | 1/2012 |

OTHER PUBLICATIONS

Extended European Search Report issued Mar. 14, 2016 in Patent Application No. 12876424.8.

* cited by examiner

DC VOLTAGE DETECTOR AND POWER CONVERTER USING THE SAME

TECHNICAL FIELD

The present invention relates to a DC voltage detector and a power converter using the same, and in particular relates to a DC voltage detector configured to detect a DC voltage and a power converter using the same.

BACKGROUND ART

A thyristor starter includes a converter configured to convert a first three-phase AC power to a DC power, a DC reactor configured to smooth a direct current, and an inverter configured to convert the DC power supplied from the converter via the DC reactor to a second three-phase AC power which is supplied to a synchronous motor. The thyristor starter further includes an AC voltage detector configured to detect a first three-phase AC voltage input to the converter and a second three-phase AC voltage output from the inverter, and a control circuit configured to control the converter and the inverter on the basis of a detection result from the AC voltage detector. By controlling the second three-phase AC power, it is possible to start the synchronous motor from a stopped state and make it rotate at a predetermined rotating speed (for example, see Japanese Patent Laying-Open No. 2003-61380 (PTD 1)).

CITATION LIST

Patent Document

PTD 1: Japanese Patent Laying-Open No. 2003-61380

SUMMARY OF INVENTION

Technical Problem

In the thyristor starter, in order to prevent a DC voltage supplied to the inverter from becoming excessively great to break down the inverter or the like, and/or to monitor the ripples of the DC voltage, it is preferable to provide a DC voltage detector configured to detect the DC voltage. However, if the DC voltage detector is provided separately, the thyristor starter will be made large in size and expensive in price.

Therefore, a primary object of the present invention is to provide a DC voltage detector compact in size and cheap in price and a power converter using the same.

Solution to Problem

A DC voltage detector according to the present invention is configured to detect, in a power converter which converts a first AC voltage to a DC voltage and converts the DC voltage to a second AC voltage to be supplied to a load, the DC voltage, and is provided with an AC voltage detector configured to detect the first AC voltage or the second AC voltage; and an arithmetic circuit configured to determine the DC voltage on the basis of the first AC voltage or the second AC voltage detected by the AC voltage detector.

Preferably, the load is a synchronous motor. The power converter is a thyristor starter for starting the synchronous motor, and includes a converter configured to convert a first AC power to a DC power, a DC reactor configured to smooth a direct current, and an inverter configured to convert the DC power supplied from the converter via the DC reactor to a second AC power which is supplied to the synchronous motor. Each of the converter and the inverter includes a plurality of thyristors. Each of the first AC voltage and the second AC voltage is a three-phase AC voltage. The first AC voltage is a voltage input to the converter. The second AC voltage is a voltage output from the inverter, and the frequency of the second AC voltage is variable.

Preferably, the arithmetic circuit, on the basis of the first or second AC voltage detected by the AC voltage detector and a plurality of control signals for controlling the plurality of thyristors included in the converter or the inverter, determines the DC voltage output from the converter or the DC voltage input to the inverter.

A power converter according to the present invention includes a converter configured to convert a first AC power to a DC power, a DC reactor configured to smooth a direct current, an inverter configured to convert the DC power supplied from the converter via the DC reactor to a second AC power which is supplied to a load, an AC voltage detector configured to detect a first AC voltage input to the converter or a second AC voltage output from the inverter, and a control circuit configured to control the converter and the inverter on the basis of a detection result from the AC voltage detector. The control circuit is configured to determine a DC voltage output from the converter or a DC voltage input to the inverter on the basis of the first or second AC voltage detected by the AC voltage detector.

Preferably, each of the first AC voltage and the second AC voltage is a three-phase AC voltage, and the frequency of the second AC voltage is variable. The load is a synchronous motor, the power converter is a thyristor starter for starting the synchronous motor, and each of the converter and the inverter includes a plurality of thyristors.

Preferably, the control circuit is configured to generate a plurality of control signals for controlling the plurality of thyristors included in the inverter on the basis of a detection result from the AC voltage detector, and determine the DC voltage input to the inverter on the basis of the plurality of control signals and the second AC voltage.

Preferably, the control circuit is configured to generate a plurality of control signals for controlling the plurality of thyristors included in the converter on the basis of a detection result from the AC voltage detector, and determine the DC voltage output from the converter on the basis of the plurality of control signals and the first AC voltage.

Preferably, the thyristor starter starts a synchronous generator in a power plant as the synchronous motor.

Advantageous Effects of Invention

In the DC voltage detector according to the present invention, the DC voltage is determined on the basis of the first or second AC voltage detected by the AC voltage detector already existing in the power converter. Thereby, it is possible to make the power converter compact in size and cheap in price.

Moreover, in the power converter according to the present invention, the existing control circuit determines the DC voltage of one terminal or the other terminal of the DC reactor on the basis of the first AC voltage or the second AC voltage detected by the existing AC voltage detector. Thereby, it is not necessary to separately provide a DC voltage detector, which makes it possible to make the power converter compact in size and cheap in price.

DESCRIPTION OF EMBODIMENTS

Figure 1:
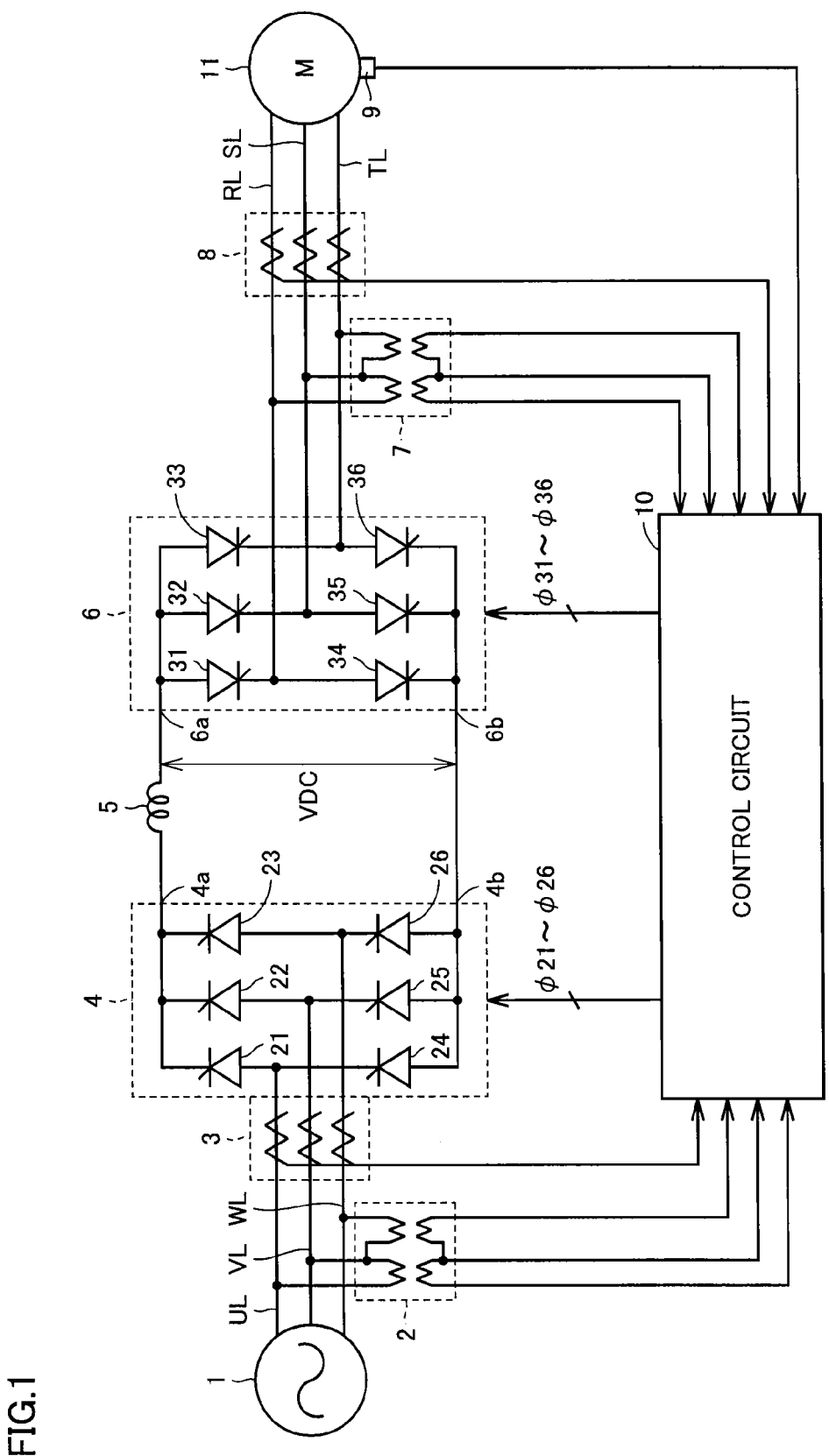
FIG. 1 is a circuit block diagram illustrating a configuration of a thyristor starter according to an embodiment of the present invention.

As illustrated in FIG. 1, a thyristor starter according to an embodiment of the present invention is configured to start a synchronous motor 11 in response to a three-phase AC power received from a commercial AC power supply (power system) 1, and is provided with AC voltage detectors 2 and 7, alternating current detectors 3 and 8, a converter 4, a DC reactor 5, an inverter 6, a rotor position detector 9, and a control circuit 10. The thyristor starter is further provided with a U-phase line UL, a V-phase line VL and a W-phase line WL which are all connected between commercial AC power supply 1 and converter 4, and a R-phase line RL, an S-phase line SL and a T-phase line TL which are all connected between inverter 6 and synchronous motor 11.

The three-phase AC voltage of a commercial frequency generated by commercial AC power supply 1 is supplied to converter 4 through U-phase line UL, V-phase line VL and W-phase line WL. AC voltage detector 2 detects a line voltage Vuv between U-phase line UL and V-phase line VL and a line voltage Vvw between V-phase line VL and W-phase line WL, and provides a signal indicating the detected values to control circuit 10. Alternating current detector 3 detects a current Iu flowing through U-phase line UL, a current Iv flowing through V-phase line VL and a current Iw flowing through W-phase line WL, and provides a signal indicating the detected values to control circuit 10.

Converter 4 converts a three-phase AC power from commercial AC power supply 1 to a DC power. Specifically, converter 4 includes thyristors 21 to 26. The anodes of thyristors 21 to 23 are connected to U-phase line UL, V-phase line VL and W-phase line WL, respectively, and the cathodes thereof are all connected to a high-voltage output terminal 4a. The cathodes of thyristors 24 to 26 are connected to U-phase line UL, V-phase line VL and W-phase line WL, respectively, and the anodes thereof are all connected to a low-voltage output terminal 4b.

The gates of thyristors 21 to 26 receive control signals φ21 to φ26 from control circuit 10, respectively. As control signals φ21 to φ26 are set at an "H" level, thyristors 21 to 26 are turned on accordingly. Turning on thyristors 21 to 26 at a predetermined timing makes it possible to convert the three-phase AC power to the DC power.

DC reactor 5 is connected between high-voltage output terminal 4a of converter 4 and a high-voltage input terminal 6a of inverter 6 and is configured to smooth the direct current. Low-voltage output terminal 4b of converter 4 is directly connected to a low-voltage input terminal 6b of inverter 6.

Inverter 6 converts the DC power supplied from converter 4 through DC reactor 5 to a three-phase AC power of a desired frequency. Specifically, inverter 6 includes thyristors 31 to 36. The anodes of thyristors 31 to 33 are all connected to high-voltage input terminal 6a, and the cathodes thereof are connected to R-phase line RL, S-phase line SL and T-phase line TL, respectively. The anodes of thyristors 34 to 36 are connected to R-phase line RL, S-phase line SL and T-phase line TL, respectively, the cathodes thereof are all connected to low-voltage input terminal 6b.

The gates of thyristors 31 to 36 receive control signals φ31 to φ36 from control circuit 10, respectively. As control signals φ31 to φ36 are set at the "H" level, thyristors 31 to 36 are turned on accordingly. Turning on thyristors 31 to 36 at a predetermined timing makes it possible to convert the DC power to the three-phase AC power of a desired frequency.

Figure 2:
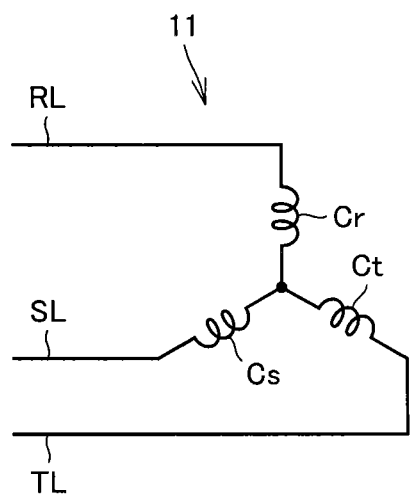
FIG. 2 is a circuit diagram illustrating a main part of a synchronous motor illustrated in FIG. 1.

The three-phase AC power generated by inverter 6 is supplied to synchronous motor 11 via R-phase line RL, S-phase line SL and T-phase line TL. As illustrated in FIG. 2, synchronous motor 11 includes a R-phase coil Cr, an S-phase coil Cs and a T-phase coil Ct. One terminal of each of coils Cr, Cs and Ct is connected to each of R-phase line RL, S-phase line SL and T-phase line TL, respectively. The other terminal of each of coils Cr, Cs and Ct is connected to a neutral point together. As coils Cr, Cs and Ct are supplied with the three-phase AC power, a rotating magnetic field is generated thereby to rotate a rotor (not shown).

Referring back to FIG. 1, AC voltage detector 7 detects a line voltage Vst between R-phase line RL and S-phase line SL and a line voltage Vst between S phase line SL and T-phase line TL, and provides a signal indicating the detected values to control circuit 10. Alternating current detector 8 detects a current Ir flowing through R-phase line RL, a current Is flowing through S-phase line SL and a current It flowing through T-phase line TL, and provides a signal indicating the detected values to control circuit 10. Rotor position detector 9 detects a rotor position of synchronous motor 11, and provides a signal indicating the detected value to control circuit 10.

Control circuit 10 controls converter 4 and inverter 6 on the basis of the signals from detectors 2, 3 and 7 to 9. For example, control circuit 10, on the basis of the detection results from AC voltage detector 2, alternating current detector 3 and rotor position detector 9, generates control signals φ21 to φ26 for thyristors 21 to 26 included in converter 4. Further, control circuit 10, on the basis of the detection results from alternating current detectors 3 and 8, AC voltage detector 7 and rotor position detector 9, generates control signals φ31 to φ36 for thyristors 31 to 36 included in inverter 6.

In starting synchronous motor 11 from a stopped state, control circuit 10 gradually increases the output from inverter 6 and increases the frequency of the three-phase AC electric power in synchronization with the rotation of synchronous motor 11 at the same time so as to increase the rotating speed of synchronous motor 11 from 0 to a predetermined value.

Further, control circuit 10, on the basis of control signals φ31 to φ36 and the detection results from AC voltage detector 7, determines a DC voltage VDC between input terminals 6a and 6b of inverter 6. The determined DC voltage VDC, for example, is used to prevent inverter 6 from being broken down as DC voltage VDC becomes excessive great (i.e., provide an overvoltage protection) and/or to monitor the ripples of DC voltage VDC.

Such kind of thyristor starter is used in a power plant, for example, to start a synchronous generator from a stopped state as a synchronous motor. When the synchronous generator is being driven to rotate at the predetermined rotating speed as the synchronous motor, while detaching the thyristor starter from the synchronous generator, the synchronous generator is driven to rotate by a gas turbine, for example, to generate AC power.

Figure 3:
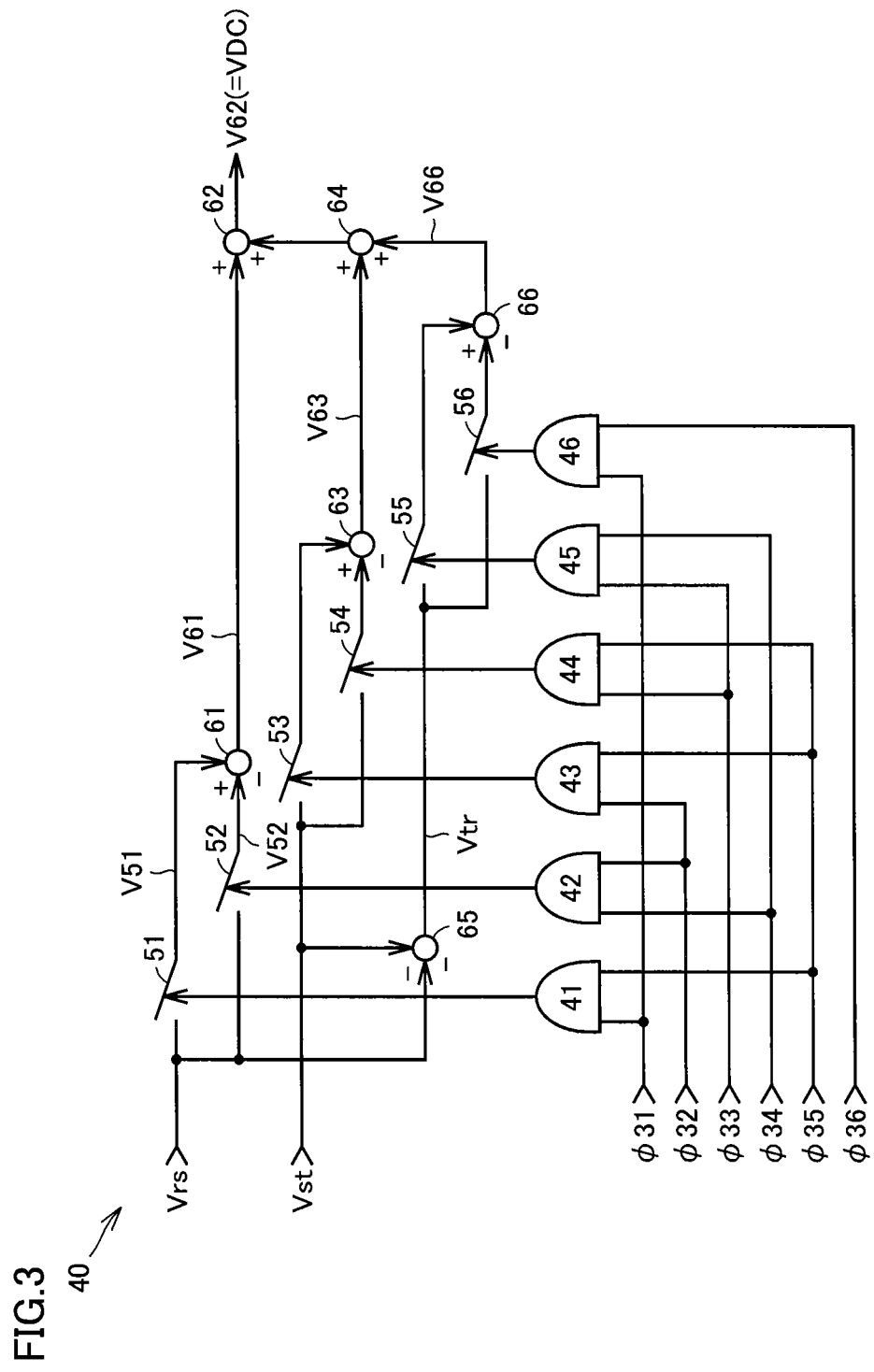
FIG. 3 is a circuit diagram illustrating a configuration of an arithmetic circuit included in a control circuit illustrated in FIG. 3.

FIG. 3 is a circuit diagram illustrating a configuration of an arithmetic circuit 40 included in control circuit 10. In FIG. 3, arithmetic circuit 40 is provided with AND gates 41 to 46, switches 51 to 56, subtractors 61, 63 and 66, and adders 62, 64 and 65.

AND gate 41 outputs a logical product signal of control signals φ31 and φ35. AND gate 42 outputs a logical product signal of control signals φ32 and φ34. AND gate 43 outputs a logical product signal of control signals φ32 and φ35. AND gate 44 outputs a logical product signal of control signals φ33 and φ35. AND gate 45 outputs a logical product signal of control signals φ33 and φ34. AND gate 46 outputs a logical product signal of control signals φ31 and φ36.

One terminal of switch 51 receives AC voltage Vrs. Switch 51 is turned on as the output signal of AND gate 41 is at the "H" level, and is turned off as the output signal of AND gate 41 is at an "L" level. One terminal of switch 52 receives AC voltage Vrs. Switch 52 is turned on as the output signal of AND gate 42 is at the "H" level, and is turned off as the output signal of AND gate 42 is at the "L" level. Subtractor 61 subtracts a voltage V52 of the other terminal of switch 52 from a voltage V51 of the other terminal of switch 51.

One terminal of switch 53 receives AC voltage Vst. Switch 53 is turned on as the output signal of AND gate 43 is at the "H" level, and is turned off as the output signal of AND gate 43 is at the "L" level. One terminal of switch 54 receives AC voltage Vst. Switch 54 is turned on as the output signal of AND gate 44 is at the "H" level, and is turned off as the output signal of AND gate 44 is at the "L" level. Subtractor 63 subtracts a voltage of the other terminal of switch 54 from a voltage of the other terminal of switch 53.

Adder 65 adds an AC voltage obtained by delaying the phase of AC voltage Vrs by 180° and an AC voltage obtained by delaying the phase of AC voltage Vst by 180° to generate an AC voltage Vtr (Vtr=−Vrs−Vst). One terminal of switch 55 receives AC voltage Vtr. Switch 55 is turned on as the output signal of AND gate 45 is at the "H" level, and is turned off as the output signal of AND gate 45 is at the "L" level. One terminal of switch 56 receives AC voltage Vtr. Switch 56 is turned on as the output signal of AND gate 46 is at the "H" level, and is turned off as the output signal of AND gate 46 is at the "L" level. Subtractor 66 subtracts the voltage of the other terminal of switch 56 from the voltage of the other terminal of switch 55. Adders 62 and 64 are configured to generate a DC voltage V62 by adding voltages V61, V63 and V64 output respectively from subtractors 61, 63 and 66.

Figure 4:
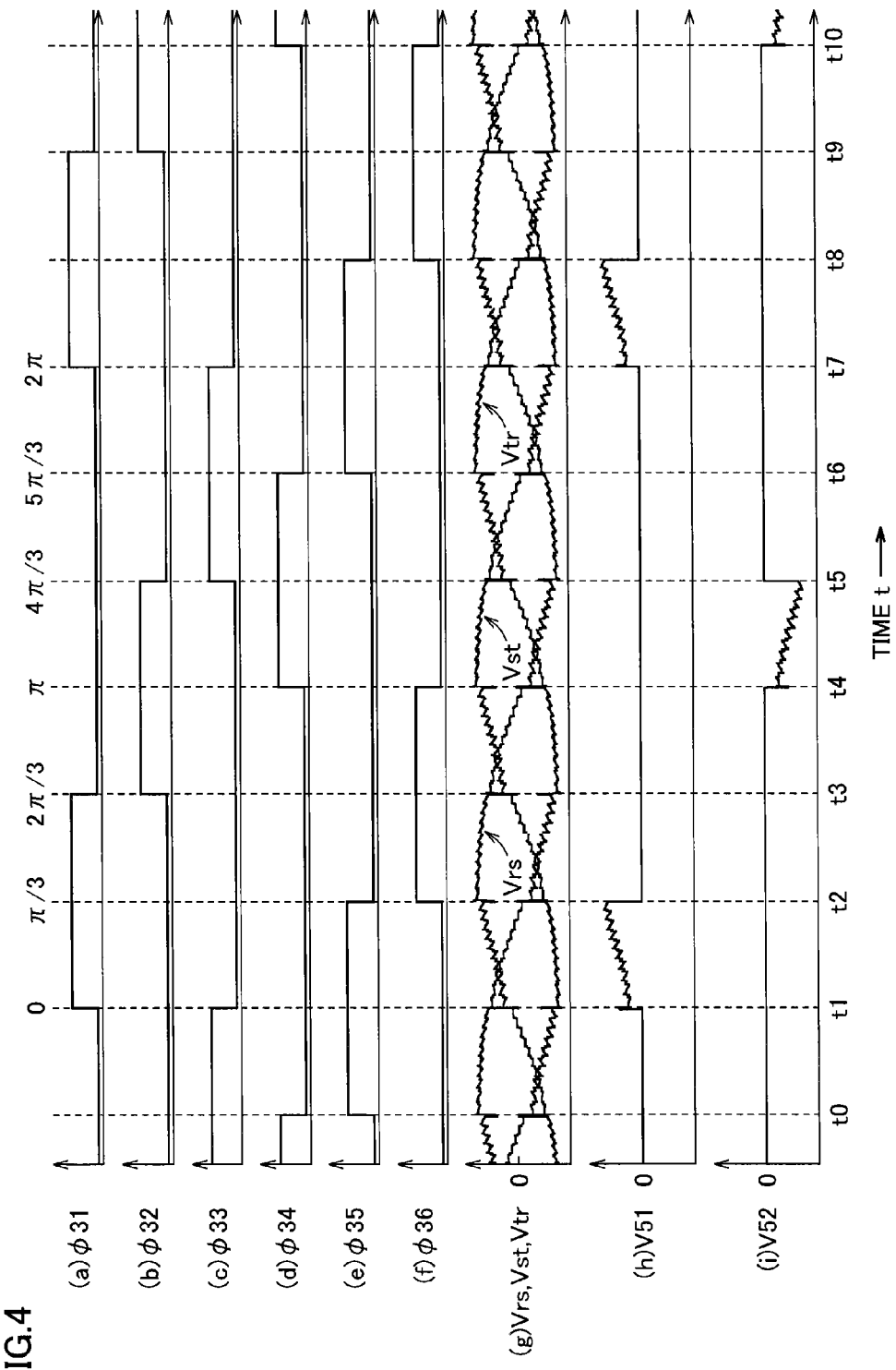
FIG. 4 is a time chart illustrating operations of the arithmetic circuit illustrated in FIG. 3.
Figure 5:
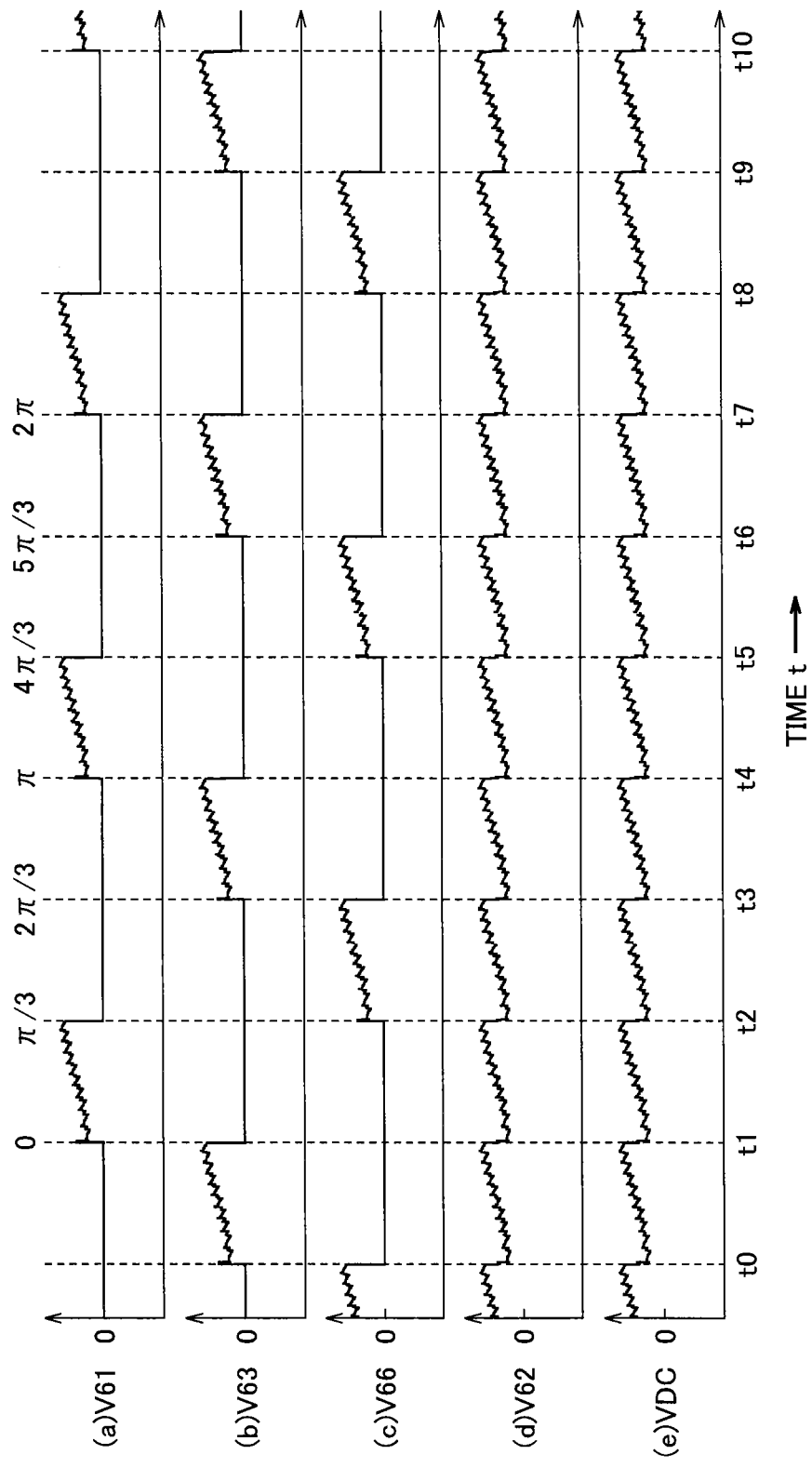
FIG. 5 is another time chart illustrating operations of the arithmetic circuit illustrated in FIG. 3.

Diagrams (a) to (i) in FIG. 4 and diagrams (a) to (e) in FIG. 5 each is a time chart illustrating the operation of arithmetic circuit 40 illustrated in FIG. 3. As illustrated in the diagrams (a) to (f) of FIG. 4, each of control signals φ31 to φ36 is a clock signal having a predetermined cycle. If one cycle is expressed by 0 to 2π, control signal φ31 becomes the "H" level from 0 to 2π/3 in one period. Control signal φ32 becomes the "H" level from 2π/3 to 4π/3 in one cycle. Control signal φ33 becomes the "H" level from 4π/3 to 2π in one period.

Each of control signals φ34 to φ36 is a signal obtained by delaying each control signals φ31 to φ32 by π, respectively. In other words, control signal φ34 becomes the "H" level π from it to 5π/3 in one period. Control signal φ35 becomes the "H" level from 0 to π/3 and from 5π/3 to 2π in one period. Control signal φ36 becomes the "H" level from π/3 to π in one period.

Further, as illustrated in the diagram (g) of FIG. 4, AC voltage Vrs fluctuates sinusoidally, and it becomes a positive voltage from 0 to π and becomes a negative voltage from π to 2π. AC voltage Vst is a voltage obtained by delaying AC voltage Vrs by 2π/3. AC voltage Vtr is a voltage obtained by delaying AC voltage Vst by 2π/3.

During the interval of 0 to 7π/3, control signals φ31 and φ35 both become the "H" level, thyristors 31 and 35 in FIG. 1 are turned on, and DC voltage VDC is applied to coils Cr and Cs in FIG. 2. The output signal of AND gate 41 in FIG. 3 becomes the "H" level, and switch 51 is turned on. Thereby, as illustrated in the diagrams (a), (e), (g) and (h) in FIG. 4, Vrs=V51=VDC during the interval of 0 to 7π/3.

Further, during the interval of π to 4π/3, control signals φ32 and φ34 both become the "H" level, thyristors 32 and 34 in FIG. 1 are turned on, and DC voltage VDC is applied to coils Cs and Cr in FIG. 2. The output signal of AND gate 42 of FIG. 3 becomes the "H" level, and switch 52 is turned on. Thereby, as illustrated in the diagrams (b), (d), (g) and (i) in FIG. 4, Vrs=V52=−VDC during the interval of π to 4π/3.

Therefore, as illustrated in the diagram (a) of FIG. 5, output voltage V61 of subtractor 61 is equal to DC voltage VDC from 0 to π/3 and from π to 4π/3 in one cycle. Similarly, as illustrated in the diagram (b) of FIG. 5, output voltage V63 of subtractor 63 is equal to DC voltage VDC from 2π/3 to π and from 5π/3 to 2π in one cycle. Further, as illustrated in the diagram (c) of FIG. 5, output voltage V66 of subtractor 66 is equal to DC voltage VDC from 7π/3 to 2π/3 and from 4π/3 to 5π/3. Thereby, as illustrated in the diagrams (d) and (e) of FIG. 5, output voltage V62 of adder 62 is equal to DC voltage VDC from 0 to 2π. DC voltage VDC in the diagram (e) of FIG. 5 is actually measured by a DC voltage detector connected between input terminals 6a and 6b of inverter 6 in FIG. 1.

As described above, in the present embodiment, arithmetic circuit 40 included in control circuit 10 determines input voltage VDC for inverter 6 on the basis of AC voltages Vrs and Vst detected by AC voltage detector 7 which is an already existing component. Therefore, it is not necessary to separately provide a DC voltage detector, which makes it possible to make the power converter compact in size and cheap in price.

Although in the present embodiment, AC voltage Vtr is determined by adder 65 from AC voltages Vrs and Vst, it is also acceptable to detect a line voltage between T-phase line TL and R-phase line RL by the AC voltage detector as AC voltage Vtr. In this case, adder 65 is removed and AC voltage Vtr detected by the AC voltage detector may be applied to one terminals of switches 55 and 56.

Although in the present embodiment, DC voltage VDC between input terminals 6a and 6b of inverter 6 is determined on the basis of control signals φ31 to φ36 from thyristors 31 to 36 and the detection values from AC voltage detector 7, it is needless to say that the DC voltage between output terminals 4a and 4b of converter 4 may be determined on the basis of control signals φ21 to φ26 from thyristors 21 to 26 in the same manner.

Although in the present embodiment, inverter 6 is described as a 6-phase converter including six thyristors 31 to 36, it is not limited thereto, and it is needless to say that inverter 6 may be configured to include any number of thyristors other than six. For example, in the case where inverter 6 is a 12-phase converter including 12 thyristors and/or even in the case where inverter 6 is a 24-phase converter including 24 thyristors, it can be used to detect DC voltage VDC in the same manner as that in the present embodiment.

Similarly, although in the present embodiment, converter 4 is described as a 6-phase converter and six thyristors 21-26, it is not limited thereto, and it is needless to say that converter 4 may be configured to include any number of thyristors other than six. For example, in the case where converter 4 is a 12-phase converter including 12 thyristors and/or even in the case where converter 4 is a 24-phase converter including 24 thyristors, it can be used to detect the DC voltage in the same manner as that in the present embodiment.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

1: commercial AC power supply; 2, 7: AC voltage detector; 3, 8: alternating current detector; 4: converter; 4a: high-voltage output terminal; 4b: low-voltage output terminal; 5: DC reactor; 6: inverter; 6a: high-voltage input terminal; 6b: low-voltage input terminal; 9: rotor position detector; 10: control circuit; 11: synchronous motor; 21-26, 31-36: thyristor; 40: arithmetic circuit; 41-46: AND gate; 51-56: switch; 61, 63, 66: subtractor; 62, 64, 65: adder; Cr: R-phase coil; Cs: S-phase coil; Ct: T-phase coil; RL: R-phase line; SL: S-phase line; TL: T-phase line; UL: U-phase line; VL: V-phase line; WL: W-phase line

The invention claimed is:

1. A DC voltage detector configured to detect, in a power converter which converts a first AC voltage to a DC voltage and converts said DC voltage to a second AC voltage to be supplied to a load, said DC voltage, comprising:
an AC voltage detector configured to detect said first AC voltage or said second AC voltage; and
an arithmetic circuit configured to determine said DC voltage on the basis of said first AC voltage or said second AC voltage detected by said AC voltage detector, wherein
said load is a synchronous motor,
said power converter is a thyristor starter for starting said synchronous motor, said power converter including
a converter configured to convert a first AC power to a DC power,
a DC reactor configured to smooth a direct current, and
an inverter configured to convert said DC power supplied from said converter via said DC reactor to a second AC power which is supplied to said synchronous motor,
each of said converter and said inverter includes a plurality of thyristors,
each of said first AC voltage and said second AC voltage is a three-phase AC voltage,
said first AC voltage is a voltage input to said converter,
said second AC voltage is a voltage output from said inverter,
the frequency of said second AC voltage is variable, and
said arithmetic circuit, on the basis of said first or second AC voltage detected by said AC voltage detector and a plurality of control signals for controlling said plurality of thyristors included in said converter or said inverter, determines said DC voltage output from said converter or said DC voltage input to said inverter.

2. A power converter comprising:
a converter configured to convert a first AC power to a DC power;
a DC reactor configured to smooth a direct current;
an inverter configured to convert said DC power supplied from said converter via said DC reactor to a second AC power which is supplied to a load;
an AC voltage detector configured to detect a first AC voltage input to said converter or a second AC voltage output from said inverter; and
a control circuit configured to control said converter and said inverter on the basis of a detection result from said AC voltage detector, wherein
each of said first AC voltage and said second AC voltage is a three-phase AC voltage,
the frequency of said second AC voltage is variable,
said load is a synchronous motor,
said power converter is a thyristor starter for starting said synchronous motor and
each of said converter and said inverter includes a plurality of thyristors, and
said control circuit is configured to generate a plurality of control signals for controlling said plurality of thyristors included in said inverter on the basis of said second AC voltage detected by said AC voltage detector, and determine said DC voltage input to said inverter on the basis of said plurality of control signals and said second AC voltage detected by said AC voltage detector.

3. A power converter comprising:
a converter configured to convert a first AC power to a DC power;
a DC reactor configured to smooth a direct current;
an inverter configured to convert said DC power supplied from said converter via said DC reactor to a second AC power which is supplied to a load;
an AC voltage detector configured to detect a first AC voltage input to said converter or a second AC voltage output from said inverter; and
a control circuit configured to control said converter and said inverter on the basis of a detection result from said AC voltage detector, wherein
each of said first AC voltage and said second AC voltage is a three-phase AC voltage,
the frequency of said second AC voltage is variable,
said load is a synchronous motor,
said power converter is a thyristor starter for starting said synchronous motor and
each of said converter and said inverter includes a plurality of thyristors, and
said control circuit is configured to generate a plurality of control signals for controlling said plurality of thyristors included in said converter on the basis of said first AC voltage detected by said AC voltage detector, and determine said DC voltage output from said converter on the basis of said plurality of control signals and said first AC voltage detected by said AC voltage detector.

4. The power converter according to claim 2, wherein said thyristor starter starts a synchronous generator in a power plant as said synchronous motor.

5. The power converter according to claim 3, wherein said thyristor starter starts a synchronous generator in a power plant as said synchronous motor.

* * * * *